United States Patent
Cao et al.

(10) Patent No.: US 11,888,449 B2
(45) Date of Patent: Jan. 30, 2024

(54) METHOD AND SYSTEM OF LINEARIZATION FOR NON-LINEAR SYSTEM

(71) Applicant: Telefonaktiebolaget LM Ericsson (publ), Stockholm (SE)

(72) Inventors: Haiying Cao, Beijing (CN); Jessica Chani, Gothenburg (SE); Per Landin, Kumla (SE); Shoaib Amin, Kumla (SE); Rui Hou, Järfälla (SE); Mohamed Hamid, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/781,758

(22) PCT Filed: Dec. 4, 2020

(86) PCT No.: PCT/CN2020/133781
§ 371 (c)(1),
(2) Date: Jun. 2, 2022

(87) PCT Pub. No.: WO2021/110114
PCT Pub. Date: Jun. 10, 2021

(65) Prior Publication Data
US 2023/0015640 A1     Jan. 19, 2023

(30) Foreign Application Priority Data
Dec. 4, 2019 (WO) ................ PCT/CN2019/123128

(51) Int. Cl.
*H03F 1/32*    (2006.01)
*H03F 3/189*    (2006.01)
*H03F 3/24*    (2006.01)

(52) U.S. Cl.
CPC ........... *H03F 1/3247* (2013.01); *H03F 3/189* (2013.01); *H03F 3/24* (2013.01); *H03F 2200/451* (2013.01); *H03F 2201/3227* (2013.01)

(58) Field of Classification Search
CPC .......... H03F 1/3247; H03F 3/189; H03F 3/24; H03F 2200/451; H03F 2201/3227
(Continued)

(56) References Cited

U.S. PATENT DOCUMENTS 10,404,296 B2 *    9/2019   Kim ...................... H03F 1/3241

OTHER PUBLICATIONS

Chain-Cahuana et al., "Iterative Learning Control for RF Power Amplifier Linearization," IEEE Transactions on Microwave Theory and Techniques, vol. 64, Issue 9, Sep. 2016, pp. 2778-2789. (Year: 2016).*

(Continued)

*Primary Examiner* — Kevin M Burd
(74) *Attorney, Agent, or Firm* — Withrow & Terranova, PLLC (57) ABSTRACT

The present disclosure provides a method of linearization for a non-linear system, comprising: a group of steps comprising: inputting an input signal to the non-linear system; obtaining an output signal from the non-linear system in response to the input signal being input to the non-linear system; obtaining a desired signal for the non-linear system; comparing the output signal with the desired signal, to determine whether the input signal is a target signal for the non-linear system to achieve a desired performance; and in response to determining that the input signal is not the target signal for the non-linear system to achieve the desired performance, generating an updated signal in frequency domain by applying a coefficient to eliminate a difference between the output signal and the desired signal, for updating the input signal to the non-linear system. The present (Continued)

disclosure also provides a corresponding device, computer programs, and computer-readable storage.

10 Claims, 8 Drawing Sheets

(58) Field of Classification Search
USPC .......................................................... 375/297
See application file for complete search history.

(56) References Cited

OTHER PUBLICATIONS

Schoukens et al., "Obtaining the Pre-Inverse of a Power Amplifier using Iterative Control," IEEE Transactions on Microwave Theory and Techniques, Jun. 2016, 6 pages. (Year: 2016).*

Schoukens et al., "Obtaining the Pre-Inverse of a Power Amplifier Using Iterative Learning Control," IEEE Transactions on Microwave Theory and Techniques, vol. 65, Issue 11, Nov. 2017, pp. 4266-4273.

Bassam, et al., "2-D Digital Predistortion (2-D-DPD) Architecture for Concurrent Dual-Band Transmitters," IEEE Transactions on Microwave Theory and Techniques, vol. 59, Issue 10, Oct. 2011, pp. 2547-2553.

Chani-Cahuana, et al., "Iterative Learning Control for RF Power Amplifier Linearization," IEEE Transactions on Microwave Theory and Techniques, vol. 64, Issue 9, Sep. 2016, pp. 2778-2789.

Morgan, et al., "A Generalized Memory Polynomial Model for Digital Predistortion of RF Power Amplifiers," IEEE Transactions on Signal Processing, vol. 54, Issue 10, Oct. 2006, pp. 3852-3860.

Norrloff, "Comparative study on first and second order ILC - frequency domain analysis and experiments," Conference on Decision and Control, Sydney, Australia, Dec. 2000, IEEE, pp. 3415-3420.

Schoukens et al., "Obtaining the Pre-Inverse of a Power Amplifier using Iterative Learning Control," IEEE Transactions on Microwave Theory and Techniques, Jun. 2016, 6 pages.

International Search Report and Written Opinion for International Patent Application No. PCT/CN2020/133781, dated Mar. 11, 2021, 11 pages.

* cited by examiner

METHOD AND SYSTEM OF
LINEARIZATION FOR NON-LINEAR
SYSTEM

This application is a 35 U.S.C. § 371 national phase filing of International Application No. PCT/CN2020/133781, filed Dec. 4, 2020, which claims the benefit of International Application No. PCT/CN2019/123128, filed Dec. 4, 2019, the disclosures of which are incorporated herein by reference in their entireties.

TECHNICAL FIELD

The present disclosure generally relates to the technical field of non-linear systems, and particularly, to a method of linearization for a non-linear system.

BACKGROUND

This section is intended to provide a background to the various embodiments of the technology described in this disclosure. The description in this section may include concepts that could be pursued, but are not necessarily ones that have been previously conceived or pursued. Therefore, unless otherwise indicated herein, what is described in this section is not prior art to the description and/or claims of this disclosure and is not admitted to be prior art by the mere inclusion in this section.

To date, especially for 5G, more and more radios require wideband and concurrent multiband capabilities to handle the increasing demand of bandwidth, spectrum management/allocation for different telecom operators and so forth. As such, wideband power amplifiers (PAs) and concurrent multiband PAs have been intensively studied through the years. Due to the inherent nonlinear nature of PAs, linearization techniques are still essential to make our radios fulfill the stringent requirement of out-of-band unwanted emission and achieve as high efficiency as possible.

In a first document—S. A. Bassam et. al, 2-D Digital Predistortion (2-D-DPD) Architecture for Concurrent Dual-Band Transmitters, IEEE Transactions on Microwave Theory and Techniques, Volume: 59, Issue: 10, Oct. 2011 and a second document—H. H. Kim et. al, Digital Compensator, U.S. Ser. No. 10/404,296B2, various approaches have been proposed for wideband and concurrent multiband linearization recently. Indirect learning architecture (ILA) is a very popular way to identify digital predistortion (DPD) parameters and most of the DPD papers published use ILA to obtain the predistorted signal to the PA, such as in a third document—the literature D. R. Morgan et. al., A Generalized Memory Polynomial Model for Digital Predistortion of RF Power Amplifiers, IEEE Transactions on Microwave Theory and Techniques, Volume: 54, Issue: 10, Oct. 2006. In a fourth document—4J. Chani-Cahuana et. al., Iterative Learning Control for RF Power Amplifier Linearization, IEEE Transactions on Microwave Theory and Techniques, Volume: 64, Issue: 9, Sep. 2016, a time-domain iterative learning control (TD-ILC) based DPD, which is a well-understood control theory technique, was proposed, which is the first time that TD-ILC is used in linearization. The target in this document is to compensate the nonlinear effects of a Power Amplifier (PA) but the method also compensates other small distortions, such as IQ-imbalance, without modification. The ILC-based DPD technique does not need to know any a-priori information of the PA and unlike ILA it does not focus on identifying the model parameters but instead yield the optimal PA input signal directly. After the optimal input signal is identified, the parameters of the DPD are found by using standard modelling approaches.

SUMMARY

In the first document, a concurrent dual-band DPD is proposed which has dedicated DPD for each band. The advantage of this proposed approach is that it can reduce the sampling rate of the DPD actuators and the digital-to-analog converters (DAC). However, it requires an additional input compared to the conventional single band DPDs. As such, it requires higher dimensions and the computational complexity will increase exponentially. In the second document, a wideband approach is proposed to handle wideband signal (>100 MHz) linearization. As bandwidth becomes even larger, the DPD processing rate and the sampling rate for the DAC is inevitably high, which also prevent a practical implementation of the DPD algorithm. The ILA used in the third document and the references therein although simplifying the identification process of the DPD, has several drawbacks for linearization. Firstly, it is very sensitive to measurement noise. Secondly, the linearization performance can be limited when the PA nonlinearity is severe. More discussions on the ILA can be found in the fourth document.

The method in the fourth document has the possibility to overcome the aforementioned computational complexity and sampling rate issues, however, the technique proposed in the fourth document used a first order approximation of the PA. Such an approximation works only if the PA has a gain and phase responses that are relatively linear over frequency. Whereas such flat gain and linear phase is quite achievable for narrow band PAs, it becomes quickly unrealistic over broader bandwidth. If the phase of any frequency component within a broad frequency range and within the entire power range deviates from its linear approximation to a certain extent, the ILC-based approach does not converge. In other words, the control loop is not stable. Instable control loops, if not treated instantly, would cause hardware failure.

Figure 1:
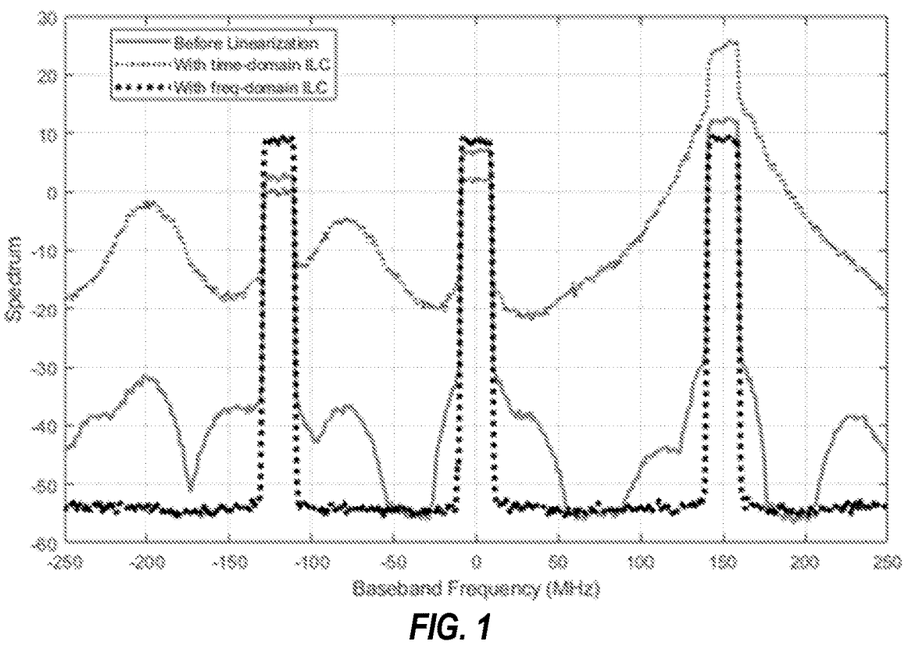
FIG. 1 illustrates output spectrum of a simulated non-linear system without linearization, using time domain ILC and using frequency domain ILC.
Figure 2:
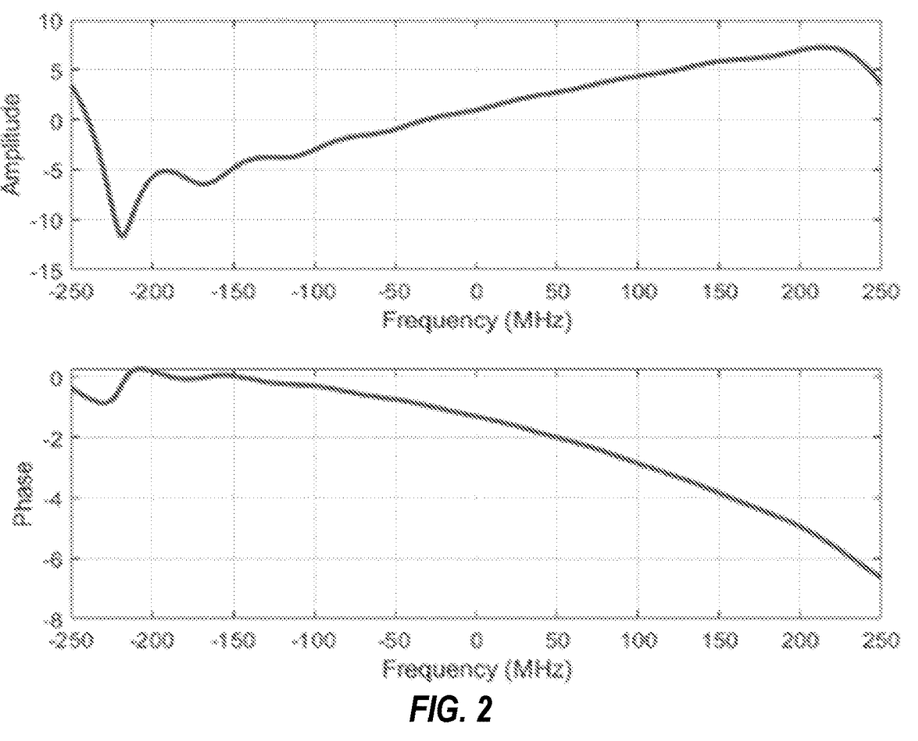
FIG. 2 illustrates a frequency response of a simulated non-linear system.

To showcase an example where conventional time domain ILC proposed in the fourth document fails, FIG. 1 shows the output spectrum obtained using time-domain ILC proposed in the fourth document and frequency-domain ILC linearization proposed here for a simulated PA with frequency response shown in FIG. 2, as well as an output from that PA without DPD. The input signal is composed of three 20 MHz-wide signals centered at −120 MHz, 0 MHz and 150 MHz. From FIG. 1, note that the frequency response of the PA varies a lot over the entire band which makes the time-domain ILC algorithm to diverge, which results in a more distorted output response, as can be seen from FIG. 2. Note also that despite such variable frequency response the frequency domain algorithm converges and is able to linearize the PA obtaining and ACLR (Adjacent Channel Leakage Ratio)<−62 dBc.

It is an object of the present disclosure to address one or more of the problems arisen in signal linearization.

According to a first embodiment of the disclosure, there is provided a method of linearization for a non-linear system, comprising: a group of steps comprising: inputting an input signal to the non-linear system; obtaining an output signal from the non-linear system in response to the input signal being input to the non-linear system; obtaining a desired signal for the non-linear system; comparing the output signal with the desired signal, to determine whether the input signal is a target signal for the non-linear system to achieve a desired performance; and in response to determining that the input signal is not the target signal for the non-linear system to achieve the desired performance, generating an updated signal in frequency domain by applying a coefficient to eliminate a difference between the output signal and the desired signal, for updating the input signal to the non-linear system.

According to a second embodiment of the disclosure, there is provided a device for linearization for a non-linear system, comprising, or comprising all of, but enabling, any one or more of the following components: an inputting component configured to obtain an input signal to the non-linear system; a first obtaining component configured to obtain an output signal from the non-linear system in response to the input signal being input to the non-linear system; a second obtaining component configured to obtain a desired signal for the non-linear system; a comparing component configured to compare the output signal with the desired signal, to determine whether the input signal is a target signal for the non-linear system to achieve a desired performance; and a generating component configured to generate an updated signal in frequency domain by applying a coefficient to eliminate a difference between the output signal and the desired signal, for updating the input signal to the non-linear system in response to determining that the input signal is not the target signal for the non-linear system to achieve the desired performance.

According to a third embodiment of the disclosure, there is provided a device for linearization for a non-linear system, comprising: a storage adapted to store instructions therein and a processor adapted to execute the instructions to cause the communication device to perform the steps of any of the methods here.

According to a fourth embodiment of the disclosure, there is provided one or more computer-readable storage storing computer-executable instructions thereon, when executed by a computing device, causing the computing device to implement the method of any of any of the methods here.

According to a fifth embodiment of the disclosure, there is provided a device adapted to perform any of the methods here.

According to a sixth embodiment of the disclosure, there is provided a computer program, comprising instructions which, when executed on at least one processor, cause the at least one processor to carry out the method according to any one of the methods here.

According to a seventh embodiment of the disclosure, there is provided a carrier containing the computer program of the eighth embodiment, wherein the carrier is one of an electronic signal, optical signal, radio signal, or computer readable storage.

According to an eighth embodiment of the disclosure, there is provided a communication device comprising a transmitter, wherein the transmitter comprises a power amplifier and any of the devices according to the second, third and fifth embodiment of the disclosure.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and details through use of the accompanying drawings.

DETAILED DESCRIPTION

Embodiments herein will be described in detail hereinafter with reference to the accompanying drawings, in which embodiments are shown. These embodiments herein may, however, be embodied in many different forms and should not be construed as being limited to the embodiments set forth herein. The elements of the drawings are not necessarily to scale relative to each other. Like numbers refer to like elements throughout.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood. It will be further understood that terms used herein should be interpreted as having a meaning that is consistent with their meaning in the context of this specification and the relevant art and will not be interpreted in an idealized or overly formal sense unless expressly so defined herein. Although embodiments are described with reference to a PA, however, the embodiments could be applied to any non-linear system other than or comprising at least a PA, including a transmitter in a radio communication system, such as a wideband transmitter in the new radio, e.g. serving for channels over 1 GHz. Narrow band transmitter and some non-radio-frequency transmitter will also be applicable to too, of course. A value, a parameter, etc. may refer to a complex value or parameter such as a vector herein.

Figure 3:
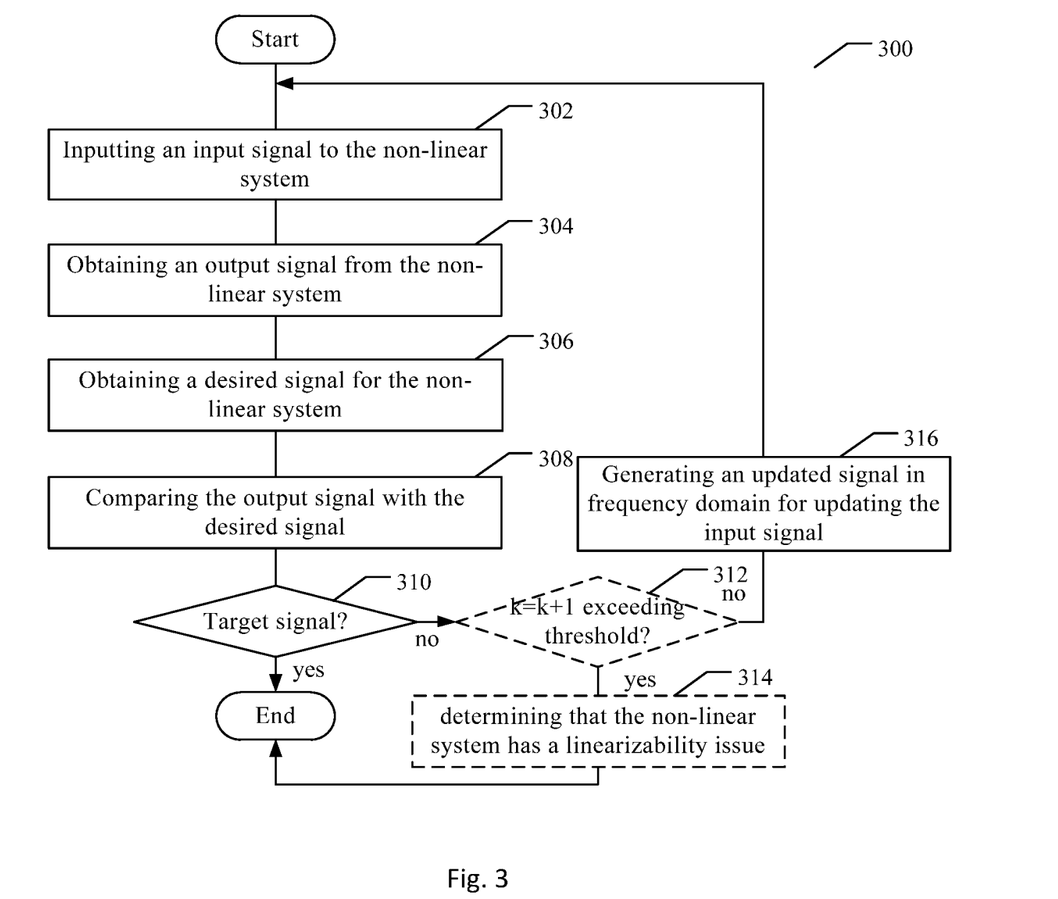
FIG. 3 illustrates a flowchart of a method of linearization for a non-linear system according to embodiments of the present disclosure.

FIG. 3 illustrates a flowchart of a method 300 of linearization for a non-linear system according to embodiments of the present disclosure.

The non-linear system may be a transmitter in a radio network is (e.g., a 5G network) or any other appropriate wireless network, for example a base station transmitter, a user equipment transmitter, a wireless access point transmitter, etc.

At step 302, an input signal is input to the non-linear system, and at step 304, an output signal from the non-linear system in response to the input signal being input to the non-linear system is obtained, i.e, the output signal is the processing result of the input signal by the non-linear system. At step 306, a desired signal for the non-linear system is obtained. Then, at step 308, the output signal is compared with the desired signal, to determine whether the input signal is a target signal for the non-linear system to achieve a desired performance in step 310.

If the result of step 310 is yes, the process ends. If the result of step 310 is no, the process may proceed to step 316 to generate an updated signal in frequency domain, by applying a coefficient to eliminate a difference between the output signal and the desired signal, for updating the input signal, and proceeds again from step 302 for iteration. In an optional example, there is a predetermined threshold for iteration times, and before proceeding to step 316, a determination is made regarding whether the iteration times exceeds the threshold at step 312. If the result of step 312 is yes, then it is determined at step 314 that the non-linear system has a linearizability issue, and the process comes to an end; otherwise, the process proceeds to step 316.

It is noted that the steps are not necessarily limited to the order being described, but can involve any appropriate orders among them, for example, step 306 could be performed before step 304 or at the same time.

It is also noted that If the desired signal remain the same for several iterations, then step 306 will not involve the calculating but only accessing.

Figure 4:
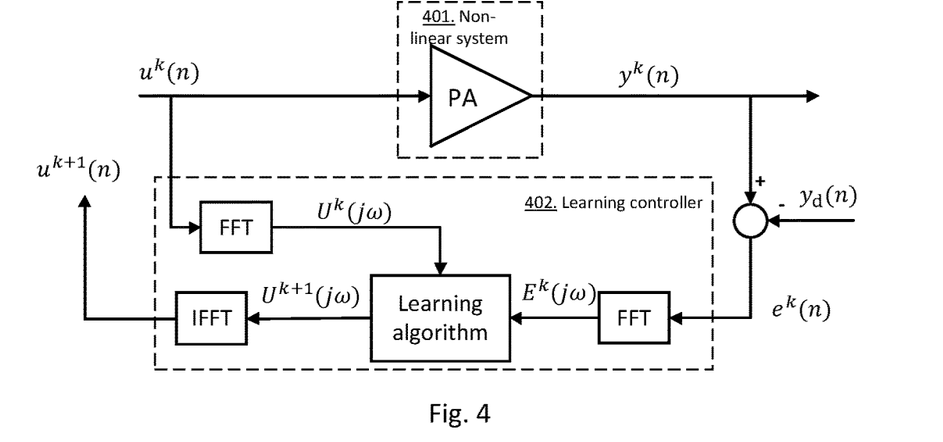
FIG. 4 illustrates a simplified block diagram for a frequency domain ILC architecture according to embodiments of the present disclosure.

FIG. 4 illustrates a simplified block diagram for a frequency domain ILC architecture according to embodiments of the present disclosure. The ILC architecture comprises a non-linear system 401 and a learning controller 402. The non-linear system is the one mentioned above, and the learning controller 402 is configured to obtain the target signal.

Before commencing description of FIG. 4, we firstly introduce workflow of the time domain ILC in a reference for comparison.

The transfer function of a PA can be defined as $y(n)=f(u(n))$, where $f(\cdot)$ is a dynamic nonlinear function, $u(n)$ and $y(n)$ are the discrete-time input and output signals, respectively. In order to linearize a given PA, a predistorted signal $u^*(n)$ is required for driving the PA to its desired linear output $y_d(n)$. $u^*(n)$ can be found iteratively using iterative learning control (ILC) in a time domain ILC based PA linearization, where $u^k(n)$ and $y^k(n)$ are the input and output signals, respectively, at k-th iteration. The error signal $e^k(n)$ is defined as $e^k(n)=y_d^k(n)-y^k(n)$. At (k+1)th iteration, the input signal is modified as $u^{k+1}(n)=u^k(n)+\Gamma e^k(n)$, which is called a learning algorithm with $\Gamma$—the weighting matrix—as its learning matrix responsible for controlling the algorithm convergence.

The error signal at iteration k+1 becomes:

$$e^{k+1}=y_d-y^{k+1}=y_d-F(u^{k+1})=y_d-F(u^k+\Gamma e^k).$$

A first order approximation of the above equation can then be derived as:

$$\begin{aligned}e^{k+1} &\approx y_d - F(u) - J_F(u^k)\Gamma e^k \\ &\approx e^k - J_{F(u^k)}\Gamma e^k \\ &\approx (I - J_F(u^k)\Gamma)e^k\end{aligned}$$

Then an arbitrary norm is used, which results in:

$$\|e^{k+1}\| \approx \|(I - J_F(u^k)\Gamma)e^k\| \leq \|(I - J_F(u^k)\Gamma)\|\|e^k\|,$$

Where I denotes the identity matrix, $J_F(U^k)$ is the Jacobian of the system in time domain. From the last equation we know that $e^{k+1}$ can be minimized by choosing the weighting matrix as the inverse of the Jacobian of the system $\Gamma=J_F(u^k)^{-1}$, i.e. the inverse of the Jacobian matrix of $F(\cdot)$.

Numerous ways for the selection of $\Gamma$ were investigated. In a reference, it has been investigated how $\Gamma$ can be approximate by real-valued gain which is generally true for narrowband systems. Such selection works well for narrowband systems where the amplitude and phase response of the PA is flat. However, in case of PAs with bandwidths of hundreds of MHz to GHz, the amplitude and phase response varies considerably over the bandwidth, therefore, this selection criteria will results in either very slow convergence or even divergence.

In an example, let $$J_F(u^k) = \begin{pmatrix} 1 & 0 \\ 0 & j(1+\epsilon) \end{pmatrix},$$

where j denotes the imaginary part and $\epsilon$ is a small positive number. Picking $$\Gamma = \begin{pmatrix} 1 & 0 \\ 0 & C \end{pmatrix}$$

and computing the absolute value of the factor results in $$\begin{pmatrix} 0 & 0 \\ 0 & \sqrt{1+C^2((1+\epsilon))^2} \end{pmatrix}.$$

In order to not diverge, we can only choose C as zero value which does not give any improvement for the second sample if we wish to avoid divergence.

Now is the description of FIG. 4. In the k-th iteration the input signal $u^k(n)$ is sent to the non-linear system 401 such as a transmitter and the output $y^k(n)$ is acquired. The error signal $e^k(n)$ and the current input $u^k(n)$ is sent to the learning controller 402. Those signals are transformed to the frequency-domain signals $U^k(j\omega)$ and $E^k(j\omega)$ via fast Fourier transforming (FFT) respectively to then be used in the learning algorithm in function (1) below which calculates the signal $U^{k+1}(j\omega)$. $u^{k+1}(j\omega)$ is then transformed back by invert fast Fourier transforming (IFFT) to time domain to generate $u^{k+1}(n)$, this signal is sent to the non-linear system 401 in the next iteration.

The notations in FIG. 4 are explained as follows. $u^k(n)$ is the input signal at iteration k, $y^k(n)$ is the output signal from the nonlinear system at iteration k. $y_d^k(n)$ is the desired signal at iteration k. $e^k(n)=y_d^k(n)-y^k(n)$ is the difference between the desired signal and the output signal at iteration k, and $u^{k+1}(n)$ is the output of the learning controller 402 and will be the input signal at iteration k+1, k=1, 2, . . . , threshold of iteration times. It is noted that the signals here can be considered as vectors with N complex-valued samples, wherein n=[1, 2, . . . , N].

It is noted that $u^k(n)$ and $u^k$ may represent the same signal, where the former is a vector and the latter could be regarded as a simplified form of the former in the context herein. Similarity applies to other signals as appropriate.

Unlike the TD-ILC, instead of working in the time-domain, we switch to frequency domain in the learning controller 402 using $$u^{k+1}(j\omega)=u^k(j\omega)+\Gamma^k(j\omega)E^k(j\omega) \quad (1)$$

where $U^{k+1}(j\omega)$, $U^k(j\omega)$ and $E^k(j\omega)$ are the Fourier transforms of signals $u^{k+1}$, $u^k$ and $e^k$ respectively. $\Gamma^k(j\omega) \in \mathbb{C}^{N \times N}$ (i.e., an N×N matrix).

The goal of the algorithm (1) is to reduce the error in the next iteration.

Considering:

$$E^k(j\omega) = Y_d(j\omega) - Y^k(j\omega) \quad (2)$$

$$\begin{aligned} E^{k+1}(j\omega) &= Y_d(j\omega) - Y^{k+1}(j\omega) \\ &= Y_d(j\omega) - F(U^{k+1}(j\omega)) \\ &= Y_d(j\omega) - F(U^k(j\omega) + \Gamma^k(j\omega)E^k(j\omega)) \end{aligned} \quad (3)$$

Where $F(\cdot)$ represents the nonlinear dynamic transfer function of the system in frequency domain, i.e., $Y(j\omega)=F(U(j\omega))$.

Using a first order approximation of (3), we obtain:

$$\begin{aligned} E^{k+1}(j\omega) &\approx Y_d(j\omega) - F(U^k(j\omega)) - J_F(U^k(j\omega))\Gamma^k(j\omega)E^k(j\omega) \\ &\approx E^k(j\omega) - J_F(U^k(j\omega))\Gamma^k(j\omega)E^k(j\omega) \\ &\approx (I - J_F(U^k(j\omega))\Gamma^k(j\omega))E^k(j\omega) \end{aligned} \quad (4)$$

Where I denotes the identity matrix, $J_F(U^k(j\omega))$ is the Jacobian of the system in frequency domain which is defined as $$J_F(U(j\omega)) = \begin{bmatrix} \frac{\partial Y(j\omega(0))}{\partial U(\omega(0))} & \cdots & \frac{\partial Y(j\omega(0))}{\partial U(\omega(N))} \\ \vdots & \ddots & \vdots \\ \frac{\partial Y(j\omega(N))}{\partial U(\omega(0))} & \cdots & \frac{\partial Y(j\omega(N))}{\partial U(\omega(N))} \end{bmatrix} \quad (5)$$

with $$\omega = \left[ -\frac{f_s}{2} : \frac{f_s}{N}, : \frac{(N-1)f_s}{N} \right]$$

Where $f_s$ denotes the sample rate of the signals.

Taking an arbitrary norm for equation (4) results in:

$$\begin{aligned} \|E^{k+1}(j\omega)\| &\approx \|(I - J_F(U^k(j\omega))\Gamma^k(j\omega))E^k(j\omega)\| \leq \\ & \|(I - J_F(U^k(j\omega))\Gamma^k(j\omega))\|\|E^k(j\omega)\| \end{aligned} \quad (6)$$

From equation (5), in one embodiment, we choose:

$$\Gamma^k(j\omega)=J_F^{-1}(U^k(j\omega)) \quad (7)$$

This is a best choice to make the error to be zero, but the Jacobian of the system in the frequency domain is generally difficult to calculate.

In one embodiment, we choose $$\Gamma^k(j\omega)_{ii} = \frac{1}{H(j\omega)_{ii}} \forall\, i \in [1, N] \quad (8)$$

where $H(j\omega)$ is frequency response of the non-linear system 401, and can be easily extracted from preliminary measurements.

In another embodiment, we choose to make a more accurate approximation of $J_F(U^k(j\omega))$ by using a frequency-model of the non-linear system 401, e.g. using frequency-domain formulation of a Volterra model of the non-linear system 401. The convergence rate will be improved as a result.

Note that the present disclosure is not limited to the above embodiments of $\Gamma^k(j\omega)$ and is open to other alternatives.

The desired signal $y_d^k$ in the k-th iteration is chosen depending on the desired signal $y_d$ and the amplification gain desired for each carrier as $$y_d^k=G(n)u^k(n) \quad (9)$$

or:

$$y_d^k=g_1(n)u_1^k(n)+g_2(n)u_2^k(n)+ \ldots +g_L(n)u_L^k(n) \quad (10)$$

Where L is the number of carriers in the input signal, and $g_1(n), g_2(n), \ldots g_L(n)$ are the amplification gains desired for respective carriers, $u_i^k(n)$ is the input signal on carrier i at iteration k. Note that those gains should be chosen according to the output capabilities of the non-linear system at the given frequency band.

It is noted that the L carriers of the input signal could be processed sequentially, or simultaneously as a vector, and the functions above only serves to illustrate the principle rather than limit the scope of the invention e.g. regarding the processing sequence.

In one example, the desired signal $y_d$ can be calculated in every iteration based on the input $u^k(n)$ at the respective iteration. However, in another example, the desired signal $y_d$ can also remain unchanged from an iteration on (such as the first iteration, i.e., $y_d=g_1(n)u_1^1(n)+g_2(n)u_2^1(n)+ \ldots +g_L(n)u_L^1(n)$), to enable offline linearization.

Figure 5:
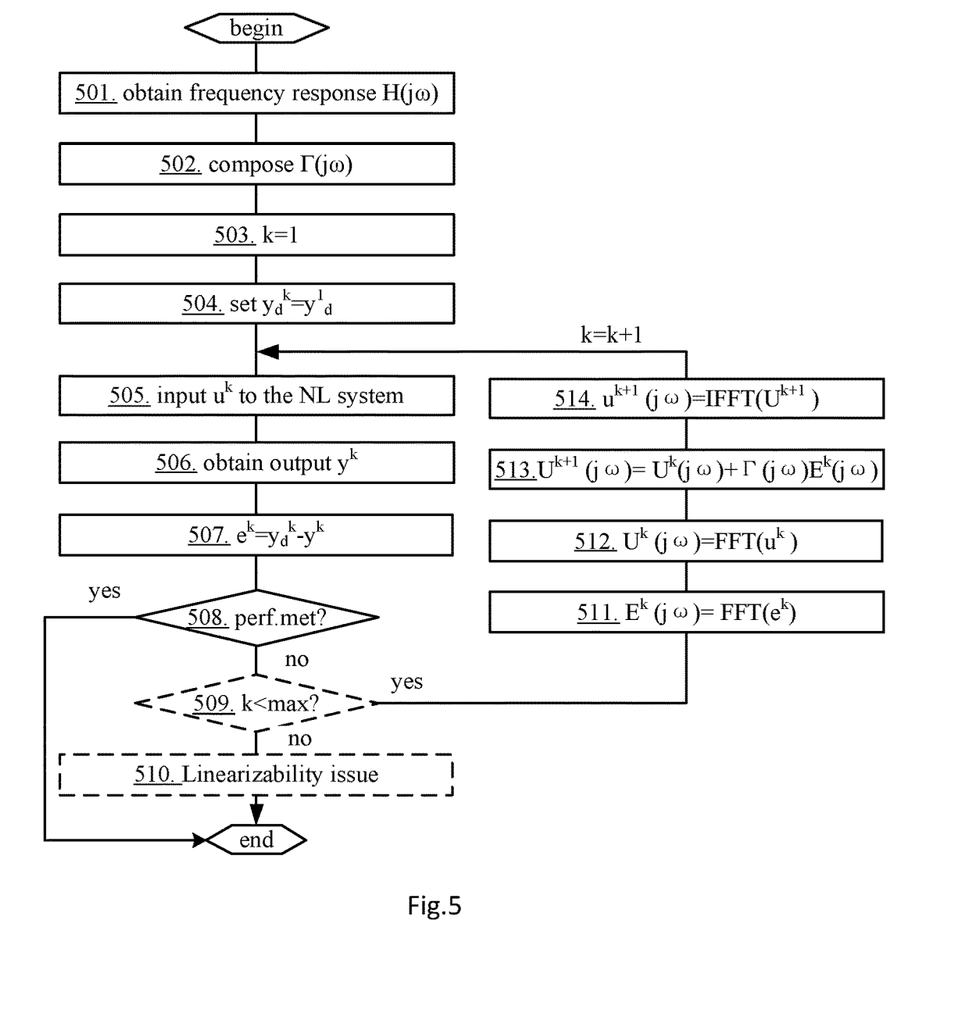
FIG. 5 illustrates a frequency domain ILC based linearization flowchart according to embodiments of the present disclosure.

FIG. 5 illustrates a frequency domain ILC based linearization flowchart according to embodiments of the present disclosure, which is a further embodiment of those mentioned above applied to the structure of FIG. 4. At step 501, frequency response $(j\omega)_1$, $H(j\omega)_2$, . . . and $H(j\omega)_N$ at N points is obtained, wherein N is the sample number. Then at step 502, compose $\Gamma^k(j\omega)$ according to function (8) above by:

$$\text{diag}\left(\frac{1}{H(j\omega)_1}, \frac{1}{H(j\omega)_2}, \cdots, \frac{1}{H(j\omega)_N}\right) \quad (11)$$

At step 503, the iteration times is initialized: k=1, and the desired signal is set as: $y_d^k = y_d^1 = =g_1(n)u_1^1(n)+g_2(n)u_2^1(n)+\ldots+g_L(n)u_L^1(n)$ according to function (10) at step 504, and this value will be used in all subsequent iterations.

Alternatively or additionally, $y_d^k$ can be calculated in every iteration.

At step 505, the input signal $u^k$ is input to the non-linear system, and a corresponding output signal $y^k$ is obtained at step 506, then a difference (i.e. the error) in time domain can be calculated: $e^k = y_d^k - y^k$ at step 507. Based on the error, a determination regarding whether the system has met the desired performance is made at step 508. If the result of step 508 is yes, then the process comes to an end, otherwise, in an optional example, the process proceeds to step 509 to check whether an iteration threshold is arrived, if arrived, the process proceeds to step 510 to determine that a linearizability issue may exist in the non-linear system and then proceeds to the end, and if not arrived, the process proceeds to step 511 to make Fourier transforms of signals $u^k$ and $e^k$ to obtain $U^k(j\omega)$ and $E^k(j\omega)$ respectively at steps 511 and 512, i.e., to generate the signals in frequency domain. Then the input signal for the next iteration k+1 could be calculated by firstly calculating its frequency domain signal at step 513 according to function (1) above, and then transforming the frequency domain signal to the one in time domain at step 514 to be input to the non-linear system at step 505 again, i.e., the next iteration begins.

It is noted that the iteration threshold may be used in some scenarios but omitted in some other scenarios, and once omitted, steps 509 and 510 will also be omitted.

The flowchart described above with reference to FIG. 5 can be to implemented in offline linearization systems by several iterations until a desired system performance is achieved.

Figure 6:
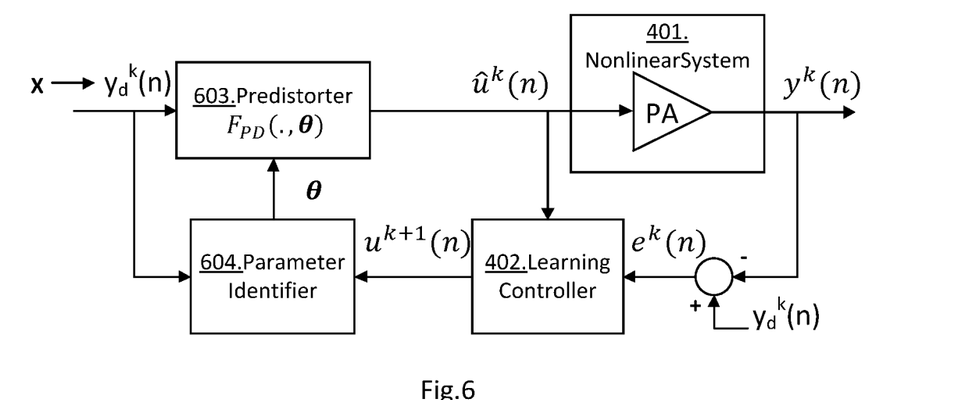
FIG. 6 illustrates another simplified block diagram of a frequency domain ILC based linearization system according to embodiments of the present disclosure.

FIG. 6 illustrates another simplified block diagram of a frequency domain ILC based linearization system according to embodiments of the present disclosure.

The learning algorithm described with reference to FIG. 4 can also be implemented in FIG. 6. A signal x to be processed is transformed to $y_d^k(n) = g_1(n)x_1^k(n)+g_2(n)x_2^k(n)+\ldots+g_L(n)x_L^k(n)$ according to function (10), and then input to a predistorter 603 for processing: $F_{PD}(\bullet,\theta)$, the resultant predistorted signal $\hat{u}^k(n)$ is sent to the non-linear system 401 (such as a transmitter) and the output $y^k(n)$ is acquired. The error signal $e^k(n)$ and the current input $\hat{u}^k(n)$ are then sent to the learning controller 402. Those signals are transformed to the frequency-domain to then be used in the learning algorithm in function (1) which calculates the signal $u^{k+1}(j\omega)$. $u^{k+1}(j\omega)$ is then transformed back to time domain to generate $u^{k+1}(n)$. $u^{k+1}(n)$ is used in combination with $y_d^k(n)$ to identify and update at least the parameter $\theta$ (which is a vector) of the predistorter 603 at a Parameter identifier 604. This process is iterated until desired performance of the non-linear system 401 has been achieved.

The non-linear system 401 and the learning controller 402 in FIG. 6 are substantially the same as that in FIG. 4 respectively, and thus functions and principles will not be reiterated here.

Figure 7:
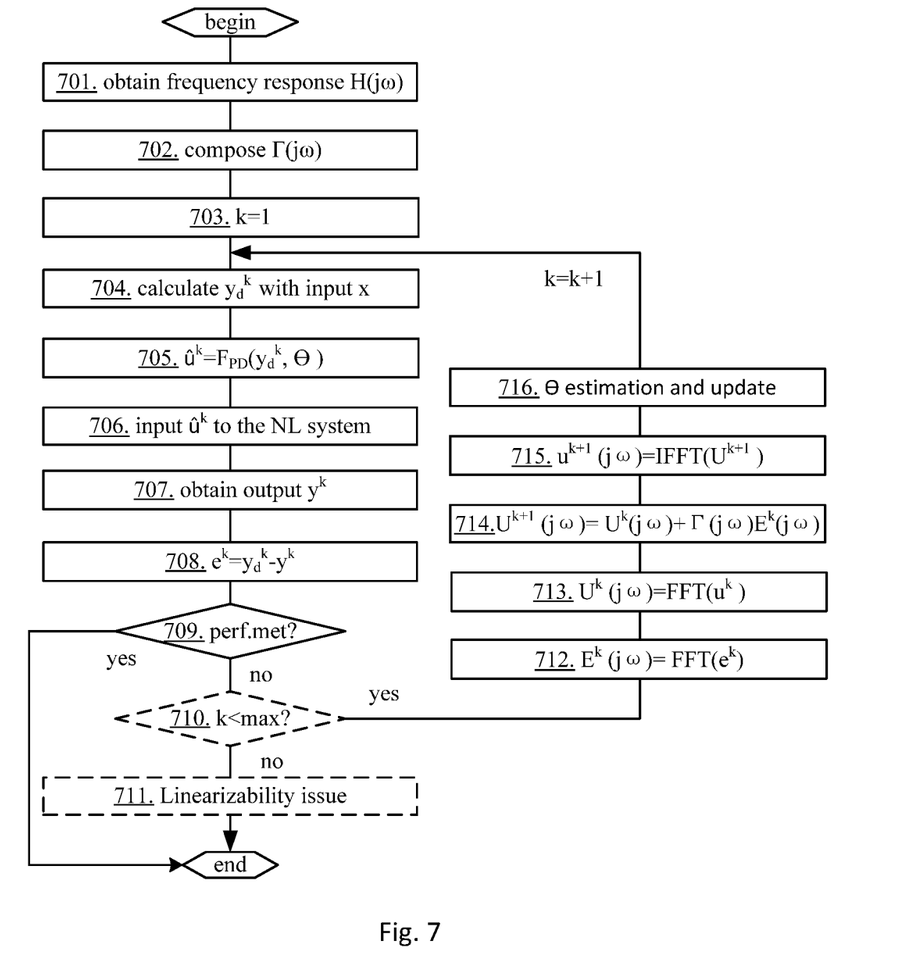
FIG. 7 illustrates another frequency domain ILC based linearization flowchart according to embodiments of the present disclosure.

FIG. 7 illustrates another frequency domain ILC based linearization flowchart according to embodiments of the present disclosure, which is a further embodiment of those mentioned above applied to the system of FIG. 6.

At step 701, frequency response $(j\omega)_1$, $H(j\omega)_2$, ... and $H(j\omega)_N$ at N points is obtained, wherein N is the sample number. Then at step 702, compose $\Gamma^k(j\omega)$ similarly to step 502:

$$\text{diag}\left(\frac{1}{H(j\omega)_1}, \frac{1}{H(j\omega)_2}, \cdots, \frac{1}{H(j\omega)_N}\right) \quad (11)$$

At step 703, the iteration times is initialized: k=1, and the desired signal is calculated as: $y_d^k(n)=g_1(n)x_1^k(n)+g_2(n)x_2^k(n)+\ldots+g_L(n)x_L^k(n)$ at step 704, and this value will be updated in each subsequent iteration to follow the input signal x.

Alternatively or additionally, $y_d^k$ can remain the same as $y_d^1$ in every iteration.

At step 705, the predistorted signal $\hat{u}^k(n)$ is calculated from $y_d^k(n)$ with the predistorter 603 and then input to the non-linear system 401 at step 706, and a corresponding output signal $y^k$ is obtained at step 707, then a difference (i.e. the error) in time domain can be calculated: $e^k = y_d^k - y^k$ at step 708. Based on the error, a determination regarding whether the system has met the desired performance is made at step 709. If the result of step 709 is yes, then the process comes to an end, otherwise, in an optional method, the process proceeds to step 710 to check whether an iteration threshold is arrived, if arrived, the process proceeds to step 711 to determine that a linearizability issue may exist in the non-linear system and then proceeds to the end, and if not arrived, the process proceeds to step 712 to make Fourier transforms of signals $u^k$ and $e^k$ to obtain $U^k(j\omega)$ and $E^k(j\omega)$ respectively at steps 712 and 713, i.e., to generate the signals in frequency domain. Then the input signal in frequency domain at the next iteration k+1 could be calculated at step 714 according to function (1) above, and this input signal in frequency domain at the next iteration k+1 is transformed to the one in time domain to identify and update in combination with $y_d^k$ at least the parameter $\theta$ of the predistorter 603. Then a new iteration k+1 begins at step 704, where a new $y_d^{k+1}$ is calculated from input signal x.

It is noted that the iteration threshold may be used in some scenarios but omitted in some other scenarios, and once omitted, steps 710 and 711 will also be omitted.

Figure 8:
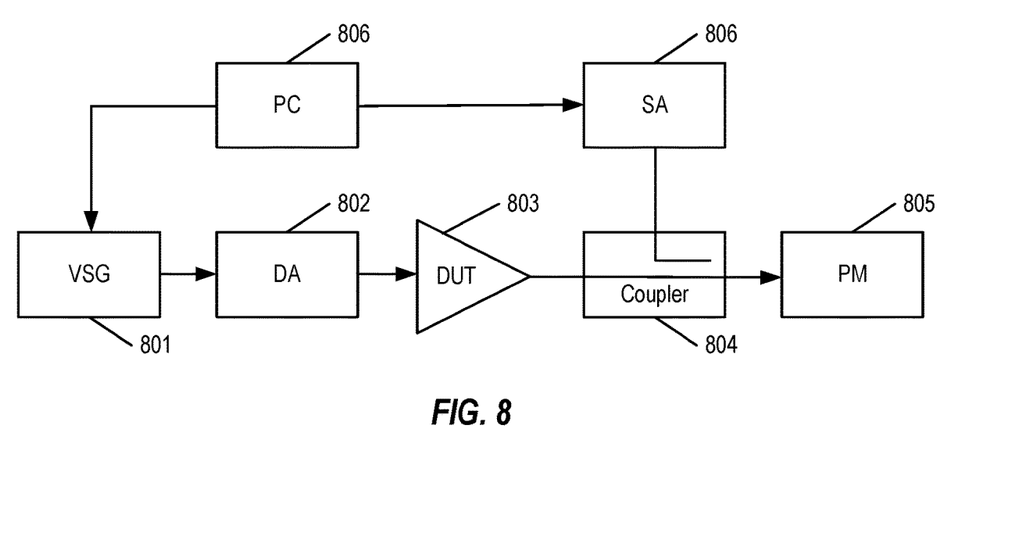
FIG. 8 illustrates a measurements setup for embodiments of the present disclosure.

Measurements have been performed with a wideband PA excited by a signal composed of 4 carriers, 20 MHz each with carriers' frequencies 750, 1250, 1450 and 1700 MHz. FIG. 8 shows the measurement setup where a vector signal generator (VSG) 801 is used to provide the excitation signal and feeds it to a driver amplifier (DA) 802 before passing the signal to the device under test (DUT) 803, such as a PA. Output signal from the DUT is captured via a spectrum analyzer (SA) 807. Optionally, a power meter (PM) 805 may be comprised to check if the power for each iteration remains the same. Then the output of DUT 803 is connected to the power meter (PM) 805 and spectrum analyzer (SA) 807 with a proper acquisition bandwidth via a directional coupler 804. A personal computer (PC) 806 is used to control both the VSG 801 and the SA 807 and to apply the frequency domain ILC proposed in this disclosure. The PC is also used to record the signals for further analysis.

Figure 9:
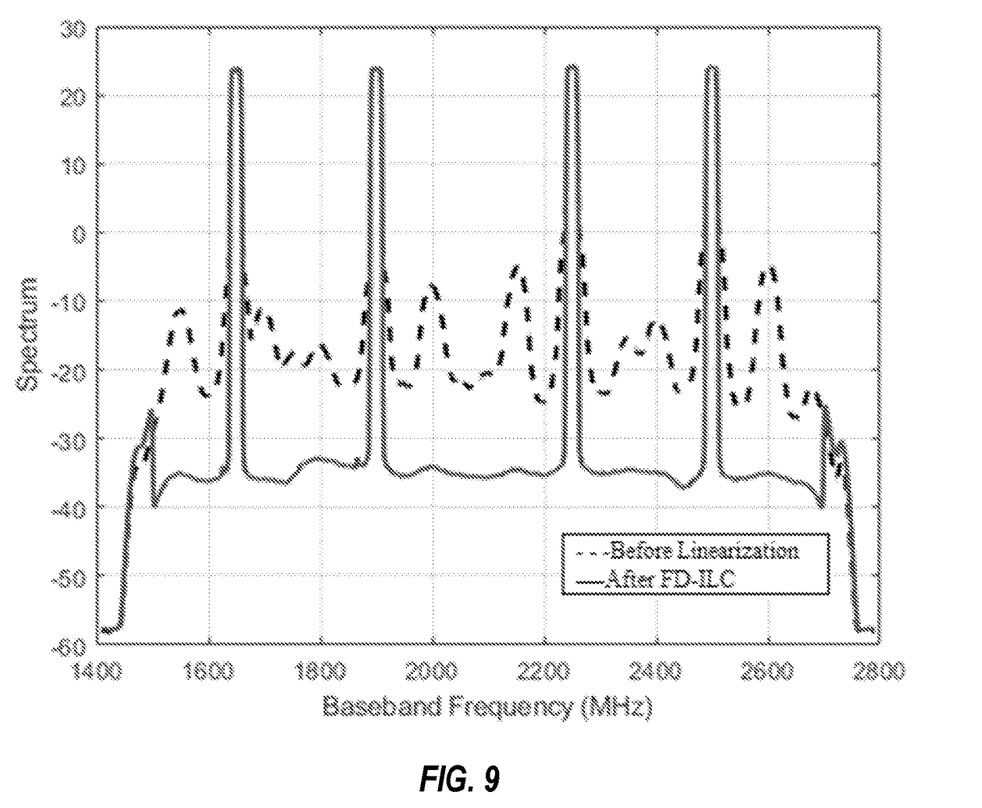
FIG. 9 illustrates output spectrum before and after linearization using frequency-domain ILC.
Figure 10:
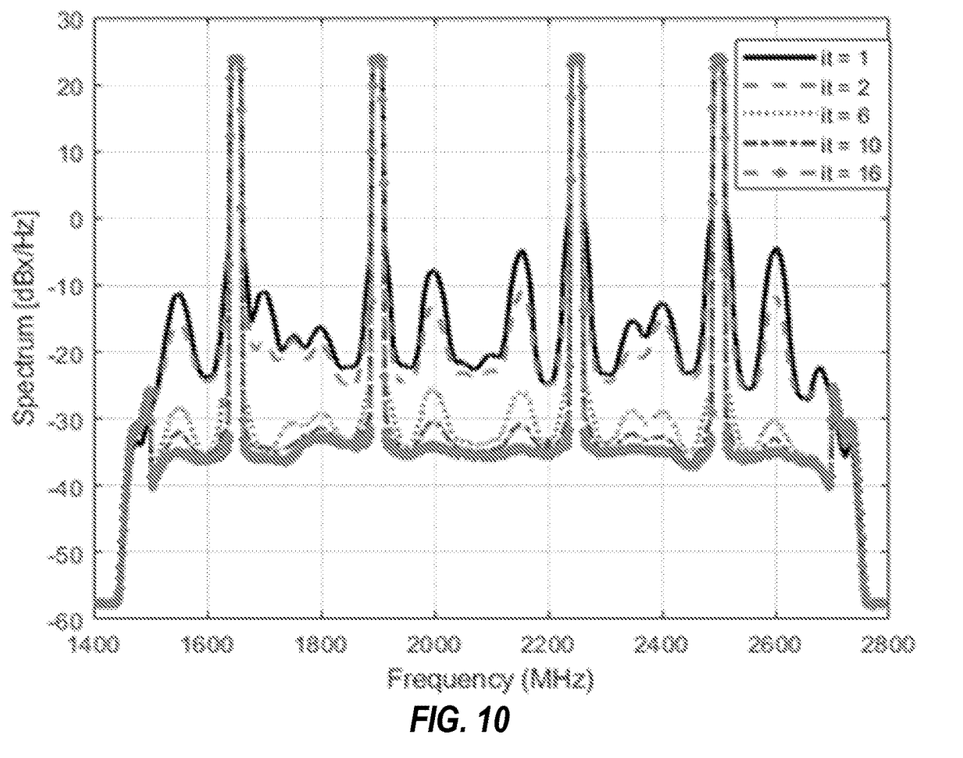
FIG. 10 illustrates evolution of the output spectrum when using frequency-domain ILC linearization according to embodiments of the present disclosure.
Figure 11:
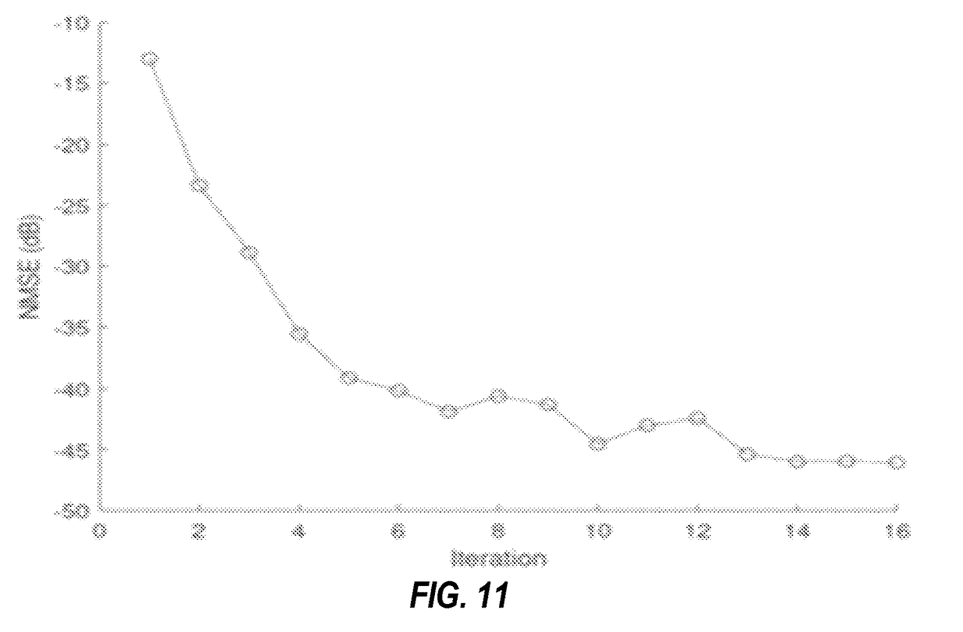
FIG. 11 illustrates NMSE results obtained using frequency domain ILC linearization according to embodiments of the present disclosure.

FIG. 9-11 shows the linearization results according to embodiments of the present disclosure. FIG. 9 shows the output spectrum obtained before linearization and after using the frequency-domain ILC algorithm described here. Note that with the present algorithm, the out-of-band distortions are reduced to up to −60 dBc over the linearization bandwidth. FIG. 10 shows how the output spectrum changes after each iteration, we can see how the out-of band distortion is reduced after each iteration. FIG. 11 shows the normalized mean square error (NMSE) calculated over the entire linearization bandwidth versus iteration number. From FIGS. 10 and 11, it can be noticed that our algorithm does converge in approximately 16 iterations.

Linearization performance for different carriers in terms of adjacent channel leakage radio (ACLR) and NMSE is shown in Table 1 below. As per the findings in Table 1, each carrier achieve an NMSE and ACLR of better than 44 dB and 54 dBc, respectively, and a difference of ~6 dB in ACLR and ~5 dB in NMSE in linearized outputs among different carriers is compensated for (reduced significantly) when using frequency domain ILC. Hence, with frequency domain ILC, homogeneous outputs are attainable in terms of output power and linearity.

TABLE 1

ACLR and NMSE before linearization and after frequency domain ILC for individual carriers

| Carrier | ACLR, before linearization dBc] | ACLR, after FD-ILC [dBc] | NMSE, before linearization [dB] | NMSE, after FD-ILC [dB] |
| --- | --- | --- | --- | --- |
| 1 | −31.7 | −54.5 | −11.1 | −44.8 |
| 2 | −31.2 | −55.5 | −11.5 | −44.3 |
| 3 | −27.0 | −55.2 | −12.4 | −44.6 |
| 4 | −25.9 | −56.1 | −07.2 | −44.7 |

Figure 12:
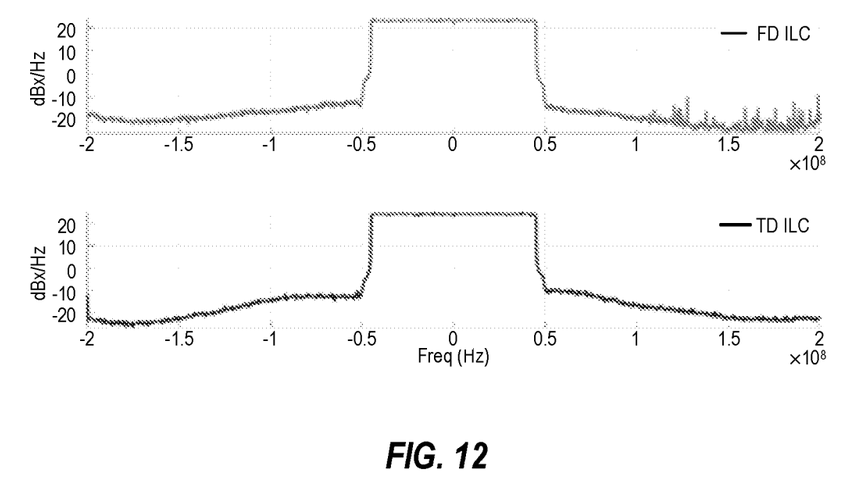
FIG. 12 illustrates a comparison between frequency domain ILC and time-domain ILC in the presence of oscillations in the PA.

FIG. 12 shows a comparison between frequency domain ILC and time-domain ILC in the presence of oscillations in the PA. Notice that, Fourier transformation decomposes a time-domain signal into its frequency domain representation and shows the power spectrum of the signal at some discrete frequencies. Similarly, in the presence of oscillations that occurs over a narrow frequency region, by frequency transformation of the signal plus oscillations into the frequency domain will generate the power spectrum of the signal plus oscillation as shown in FIG. 12. Hence, in the presence of oscillation in a PA, frequency domain ILC will allow observing these oscillations as they will have distinct spectra.

Figure 13:
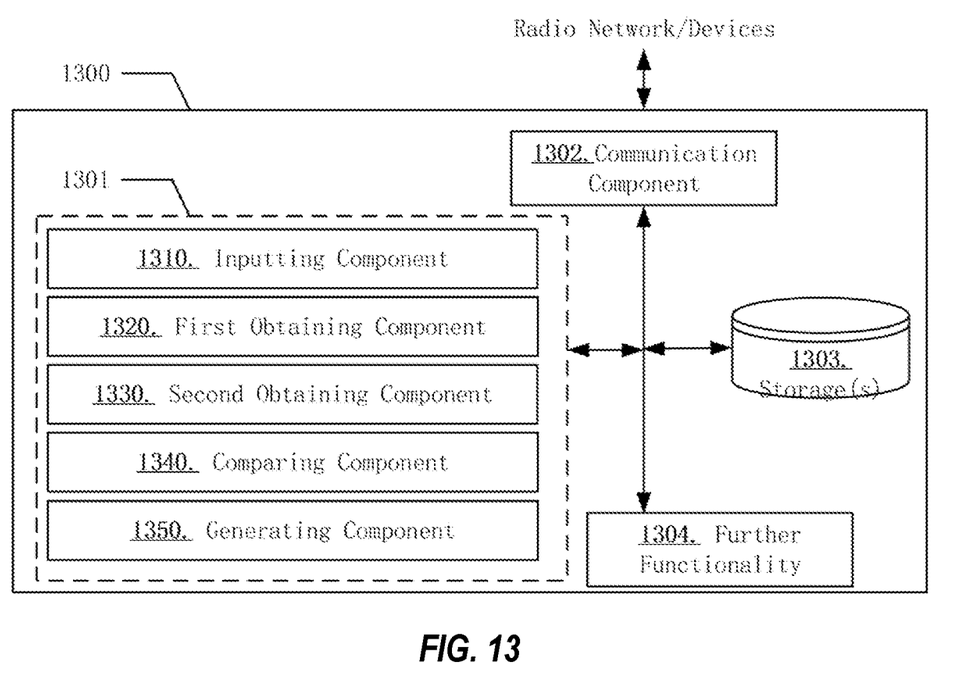
FIG. 13 illustrates a schematic block diagram of a device for linearization for a non-linear system according to embodiments of the present disclosure.

FIG. 13 illustrates a schematic block diagram of a device for linearization for a non-linear system according to embodiments of the present disclosure.

The part of device 1300 which is most affected by the adaptation of the herein described method, e.g., a part of the method 300, is illustrated as an arrangement 1301, surrounded by a dashed line. The device 1300 and arrangement 1301 may be further configured to communicate with other entities e.g. the radio network via a communication component 1302 internal or external (now shown) to the device 1300. The communication component 1302 comprises means for radio communication or wireless communication. The arrangement 1301 or device 1300 may further comprise a further functionality 1304, such as functional components providing regular user equipment functions, regular Base Station functions, or functions of any other radio communication device, and may further comprise one or more storage(s) 1303.

The arrangement 1301 could be implemented, e.g., by one or more of: a processor or a microprocessor and adequate software and memory for storing of the software, a Programmable Logic Device (PLD) or other electronic component (s) or processing circuitry configured to perform the actions described above, and illustrated, e.g., in FIGS. 3, 5 and 7. The arrangement 1301 of the device 1300 may be implemented and/or described as follows.

Referring to FIG. 13, the device 1300 is configured for linearization for a non-linear system, comprising, alternatively or additionally, or comprising all of, but enabling, any one or more of the following components: an inputting component 1310 configured to obtain an input signal to the non-linear system; a first obtaining component 1320 configured to obtain an output signal from the non-linear system in response to the input signal being input to the non-linear system; a second obtaining component 1330 configured to obtain a desired signal for the non-linear system; a comparing component 1340 configured to compare the output signal with the desired signal, to determine whether the input signal is a target signal for the non-linear system to achieve a desired performance; and a generating component 1350 configured to generate in frequency domain an updated signal to be taken as the input signal to the non-linear system in response to determining that the input signal is not the target signal for the non-linear system to achieve the desired performance.

It should be noted that two or more different components in this disclosure may be logically or physically combined. For example, the first determining component 1320 to the second determining component 1330 may be combined as one single unit.

Figure 14:
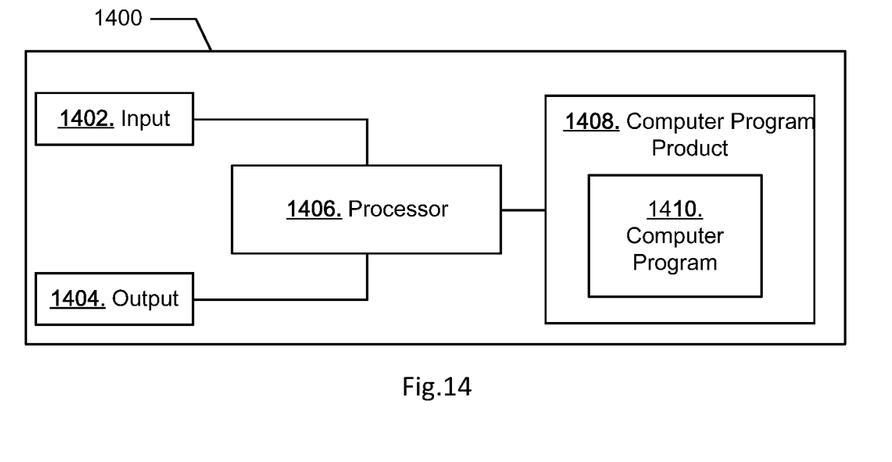
FIG. 14 schematically illustrates an embodiment of an arrangement which may be used in the device for linearization according to embodiments of the present disclosure.

FIG. 14 schematically illustrates an embodiment of an arrangement 1400 which may be used in the device for linearization according to embodiments of the present disclosure, such as the device 1300. Comprised in the arrangement 1400 are here a processor 1406, e.g., with a Digital Signal Processor (DSP). The processor 1406 may be a single unit or a plurality of units to perform different actions of procedures described herein. The arrangement 1400 may also comprise an input unit 1402 for receiving signals from other entities, and an output unit 1404 for providing signal(s) to other entities. The input unit and the output unit may be arranged as an integrated entity or as illustrated in the example of FIG. 14.

Furthermore, the arrangement 1400 comprises at least one computer program product 1408 in the form of a non-volatile or volatile memory, e.g., an Electrically Erasable Programmable Read-Only Memory (EEPROM), a flash memory and a hard drive. The computer program product 1408 comprises a computer program 1410, which comprises code/computer readable instructions, which when executed by the processor 1406 in the arrangement 1400 causes the arrangement 1400 and/or the device in which it is comprised to perform the actions, e.g., of the procedure described earlier in conjunction with FIGS. 3, 5 and/or 7.

The computer program 1410 may be configured as a computer program code structured in computer program modules. Hence, in an exemplifying embodiment when the arrangement 1400 is used in the device 1300, the code in the computer program of the arrangement 1400 when executed, will cause the processor 1406 to perform the steps as described with reference to FIGS. 3, 5 and/or 7.

The processor 1406 may be a single Central Processing Unit (CPU), but could also comprise two or more processing units. For example, the processor 1406 may include general purpose microprocessors, instruction set processors and/or related chip sets and/or special purpose microprocessors such as Application Specific Integrated Circuits (ASIC). The processor 1406 may also comprise board memory for caching purposes. The computer program 1410 may be carried by a computer program product 1408 connected to the processor 1406. The computer program product may comprise a computer readable medium on which the computer program is stored. For example, the computer program product may be a flash memory, a Random-access memory (RAM), a Read-Only Memory (ROM), or an EEPROM, and the computer program modules described above could in alternative embodiments be distributed on different computer program products in the form of memories.

The arrangement 1400 can be a base station, sometimes also referred to in the art as a Base Transceiver Station (BTS), a macro base station, a node B, or B-node, an eNodeB (eNB), a gNodeB (gNB), etc, and is sometimes also referred to in the art as a micro/femto/pico base stations, a micro/femto/pico node B, or micro/femto/pico B-node, a micro/femto/pico eNodeB (eNB), etc. Besides, the arrangement 1400 could also be any other device in the wireless network, such as a WLAN access point, etc.

The arrangement 1400 may also be a user equipment (UE). UEs may be served by cells and the numbers served by different cells need not to be identical. The term "UE" used herein may indicate all forms of devices enabled to communicate via a communication network, such as mobile telephones ("cellular" telephones) and laptops with mobile termination, and thus can be, for example, portable, pocket, hand-held devices, such as mobile phones, smart phones, personal digital assistants (PDA); computer-included devices, such as desktops, laptops; vehicles, or other devices, such as meters, household appliances, medical appliances, multimedia devices, automobile-mounted devices, etc., which communicate voice and/or data via radio access network.

By scenarios or as a whole, unlike the conventional ILC technique, embodiments of the present disclosure can guarantee the convergence even for wide band non-linear systems such as PAs of which the gain and phase response might vary a lot over the band of interest. Embodiments of the present disclosure do not rely on any models to obtain the optimal input signal for non-linear systems and it works well pervasively for different bandwidths and responses of the non-linear system. Embodiments of the present disclosure may also facilitate linearizability tests for the non-linear system and make it easier for PA/DPD engineers to find out the problems. Training a DPD model can become easier, which does not require any more measurements data once a target signal for the non-linear system to achieve a desired performance is obtained. The frequency domain ILC of the present disclosure produces an unbiased estimate of the target signal, which can be directly used for estimating conventional DPD-parameters without requiring complex nonlinear optimizations. Besides, the frequency domain ILC yields a performance bound, general DPD solutions cannot exceed this bound but only try to approach it. Therefore, embodiments of the present disclosure are valuable in yielding a quantitative DPD target for a specific non-linear system. In presence of oscillations in the non-linear system, embodiments of the present disclosure of frequency domain ILC allows to observe these, as the oscillations are confined to narrow frequency region, whereas, the same is not possible with time domain ILC.

While the embodiments have been illustrated and described herein, it will be understood by those skilled in the art that various changes and modifications may be made, and equivalents may be substituted for elements thereof without departing from the true scope of the present technology. In addition, many modifications may be made to adapt to a particular situation and the teaching herein without departing from its central scope. Therefore it is intended that the present embodiments not be limited to the particular embodiment disclosed as the best mode contemplated for carrying out the present technology, but that the present embodiments include all embodiments falling within the scope of the appended claims.

The invention claimed is:

1. A method of linearization for a non-linear system, comprising: repeatedly performing a group of steps comprising:

inputting an input signal to the non-linear system;

obtaining an output signal from the non-linear system in response to the input signal being input to the non-linear system;

obtaining a desired signal for the non-linear system;

comparing the output signal with the desired signal to determine whether the input signal is a target signal for the non-linear system to achieve a desired performance; and in response to determining that the input signal is not the target signal for the non-linear system to achieve the desired performance, generating an updated input signal in a frequency domain by adding the input signal in the frequency domain and a difference between the output signal and the desired signal in the frequency domain, multiplied by a coefficient and providing the updated input signal to the non-linear system, wherein the non-linear system is a wideband non-linear system, and the coefficient is an inverse of a Jacobian of the non-linear system in the frequency domain.

2. The method of claim 1, wherein repeatedly performing the group of steps comprises:

performing the group of steps a number of times, with the updated input signal taken as the input signal each time, until determining that the input signal is the target signal for the non-linear system to achieve the desired performance.

3. The method of claim 1, further comprising:

in response to no target signal being determined after repeatedly performing the group of steps a number of times that exceeds a predetermined threshold, determining that the non-linear system has a linearizability issue.

4. The method of claim 1, wherein the comparing further comprises calculating a difference of the output signal and the desired signal, to determine whether the input signal is the target signal for the non-linear system to achieve the desired performance based on the difference.

5. The method of claim 2, wherein the desired signal in every performing of the group of steps is set to be a same value.

6. The method of claim 2, wherein the desired signal is updated in performing of the group of steps each time.

7. The method of claim 1, wherein the non-linear system is a transmitter in radio communications.

8. A device for linearization for a non-linear system, comprising, or comprising all of, but enabling, the following components:

an inputting component configured to obtain an input signal to the non-linear system;

a first obtaining component configured to obtain an output signal from the non-linear system in response to the input signal being input to the non-linear system;

a second obtaining component configured to obtain a desired signal for the non-linear system;

a comparing component configured to compare the output signal with the desired signal to determine whether the input signal is a target signal for the non-linear system to achieve a desired performance; and a generating component configured to generate an updated input signal in a frequency domain by adding the input signal in the frequency domain and a difference between the output signal and the desired signal in the frequency domain, multiplied by a coefficient and providing the updated input signal to the non-linear system in response to determining that the input signal is not the target signal for the non-linear system to achieve the desired performance, wherein the non-linear system is a wideband non-linear system, and the coefficient is an inverse of a Jacobian of the non-linear system in the frequency domain.

9. A device for linearization for a non-linear system, comprising:

a storage, adapted to store instructions therein;

a processor, adapted to execute the instructions to cause the device to repeatedly perform a group of actions comprising:

input an input signal to the non-linear system;

obtain an output signal from the non-linear system in response to the input signal being input to the non-linear system;

obtain a desired signal for the non-linear system;

compare the output signal with the desired signal to determine whether the input signal is a target signal for the non-linear system to achieve a desired performance; and in response to determining that the input signal is not the target signal for the non-linear system to achieve the desired performance, generate an updated input signal in a frequency domain by adding the input signal in the frequency domain and a difference between the output signal and the desired signal in the frequency domain, multiplied by a coefficient and providing the updated input signal to the non-linear system, wherein the non-linear system is a wideband non-linear system, and the coefficient is an inverse of a Jacobian of the non-linear system in the frequency domain.

10. A non-transitory computer-readable medium storing computer-executable instructions thereon that, when executed by a computing device, cause the computing device to repeatedly perform a group of actions comprising:

input an input signal to a non-linear system;

obtain an output signal from the non-linear system in response to the input signal being input to the non-linear system;

obtain a desired signal for the non-linear system;

compare the output signal with the desired signal to determine whether the input signal is a target signal for the non-linear system to achieve a desired performance; and in response to determining that the input signal is not the target signal for the non-linear system to achieve the desired performance, generate an updated input signal in a frequency domain by adding the input signal in the frequency domain and a difference between the output signal and the desired signal in the frequency domain, multiplied by a coefficient and providing the updated input signal to the non-linear system, wherein the non-linear system is a wideband non-linear system, and the coefficient is an inverse of a Jacobian of the non-linear system in the frequency domain.

* * * * *